US009230618B2

(12) United States Patent
Ogiwara et al.

(10) Patent No.: US 9,230,618 B2
(45) Date of Patent: Jan. 5, 2016

(54) SEMICONDUCTOR STORAGE DEVICE

(71) Applicant: Kabushiki Kaisha Toshiba, Minato-ku (JP)

(72) Inventors: Ryu Ogiwara, Yokohama (JP); Daisaburo Takashima, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/482,098

(22) Filed: Sep. 10, 2014

(65) Prior Publication Data

US 2015/0255127 A1 Sep. 10, 2015

Related U.S. Application Data

(60) Provisional application No. 61/948,862, filed on Mar. 6, 2014.

(51) Int. Cl.
*G11C 7/06* (2006.01)
*G11C 5/06* (2006.01)
*G11C 7/12* (2006.01)
*G11C 7/10* (2006.01)

(52) U.S. Cl.
CPC *G11C 7/062* (2013.01); *G11C 5/06* (2013.01); *G11C 7/12* (2013.01); *G11C 7/1051* (2013.01); *G11C 7/1069* (2013.01)

(58) Field of Classification Search
CPC .......................................................... G11C 7/06
USPC .................................................... 365/189.15
See application file for complete search history.

(56) References Cited

U.S. PATENT DOCUMENTS

| 6,819,600 B2 | 11/2004 | Sim |
| 7,064,972 B2 * | 6/2006 | Takashima ............. G11C 11/22 365/145 |
| 7,593,257 B2 | 9/2009 | Murayama et al. |
| 8,027,206 B2 | 9/2011 | Yoon et al. |

FOREIGN PATENT DOCUMENTS

| JP | 2004-39216 | 2/2004 |
| JP | 2006-260742 | 9/2006 |
| JP | 2012-516523 | 7/2012 |

OTHER PUBLICATIONS

Yohji Watanabe et al. "Offset Compensating Bit-Line Sensing Scheme for High Density DRAM's" IEEE Journal of Solid-State Circuits, vol. 29, No. 1, 1994, 5 pages.

(Continued)

*Primary Examiner* — Son Mai
(74) *Attorney, Agent, or Firm* — Oblon, McClelland, Maier & Neustadt, L.L.P.

(57) ABSTRACT

A semiconductor storage device according to the present embodiment includes a memory cell array including a plurality of memory cells. First bit lines transmit read signal voltages from the memory cells. A gate of a first transistor is connected to the first bit lines. A second bit line is connected to one of a drain and a source of the first transistor. A step voltage line is connected to the other one of the drain and the source of the first transistor to apply a step voltage changing in a stepwise manner to the first transistor at a time of reading. A reference-voltage generator generates a reference voltage. A sense part is connected to the second bit line to receive the read signal voltages and the reference voltage.

19 Claims, 16 Drawing Sheets

(56) References Cited

OTHER PUBLICATIONS

Edmund J. Sprogis "A Technique for Measuring Threshold Mismatch in DRAM Sense Amplifier Devices", Proc. IEEE 1991 Int. Conference on Microelectronics Test Structures, vol. 4, No. 1, 1991, 4 pages.

Shunichi Suzuki et al. "Threshold Difference Compensated Sense Amplifier", IEEE Journal of Solid-State Circuits, Vo. SC-14, No. 6, 1979, 5 pages.

Tohru Furuyama et al. "A New Sense Amplifier Technique for VLSI Dynamic RAM'S", IEDM 81, 1981, 5 pages.

Junji Tominaga et al. "Electrical-field induced giant magnetoresistivity in (non-magnetic) phase change films", Applied Physics Letters 99, 152105, 2011, 4 pages.

Tz-Yi Liu et al. "A 130. $7mm^2$ 2-layer 32Gb ReRAM Memory Device in 24nm Technology", ISSCC 2013/Session 12/Non-Volatile Memory Solutions/12.1, 2013, 3 pages.

Shinichiro Shiratake, et al, "A 32-Mb chain FeRAM with segment/stitch array architecture", IEEE Journal of Solid-State Circuits, vol. 38, No. 11, Nov. 2003, pp. 1911-1919.

Hidehiro Shiga, et al., "A 1.6 GB/s DDR2 128 Mb chain FeRAM with scalable octal bitline and sensing schemes", IEEE Journal of Solid-State Circuits, vol. 45, No. 1, Jan. 2010, pp. 142-152.

Katsuhiko Hoya, et al., "A 64-Mb chain FeRAM with quad BL architecure and 200 MB/s burst mode", IEEE Transactions on Very Large Scale Integration (VLSI) Systems, vol. 18, No. 12, Dec. 2010, pp. 1745-1752.

* cited by examiner

US 9,230,618 B2

SEMICONDUCTOR STORAGE DEVICE

CROSS REFERENCE TO RELATED APPLICATIONS

This application is based upon and claims the benefit of priority from the prior U.S. Provisional Patent Application No. 61/948,862, filed on Mar. 6, 2014, the entire contents of which are incorporated herein by reference.

FIELD

The embodiments of the present invention relate to a semiconductor storage device.

BACKGROUND

Semiconductor storage devices such as a NAND flash memory have been downscaled to increase storage capacities. To realize further downscaling, development of memories using new materials is progressed. For example, new memories such as a ReRAM (Resistance Random Access Memory), a PRAM (Phase-Change RAM) or a PCM (Phase-Change Memory), an iPCM (interfacial PCM), a FeRAM (Ferroelectric Random Access Memory), a FeNAND (Ferroelectric NAND-type memory), and an MRAM (Magnetic Random Access Memory) have been developed.

As downscaling of these new memories has been progressed, variations in characteristics of elements and characteristics of transistors have become large. For example, variations in characteristics of memory elements and variations in threshold voltages of transistors included in a sense amplifier circuit cause erroneous data read. For example, there has been a demand for a circuit configuration that causes no erroneous read even when variations of pair transistors included in a sense amplifier are likely to occur.

DETAILED DESCRIPTION

Embodiments will now be explained with reference to the accompanying drawings. The present invention is not limited to the embodiments.

A semiconductor storage device according to the present embodiment includes a memory cell array including a plurality of memory cells. First bit lines transmit read signal voltages from the memory cells. A gate of a first transistor is connected to the first bit lines. A second bit line is connected to one of a drain and a source of the first transistor. A step voltage line is connected to the other one of the drain and the source of the first transistor to apply a step voltage changing in a stepwise manner to the first transistor at a time of reading. A reference-voltage generator generates a reference voltage. A sense part is connected to the second bit line to receive the read signal voltages and the reference voltage.

Embodiments of the present invention are applicable to any of current-detection memories such as a ReRAM, a PRAM or a PCM, an iPCM, a FeNAND, and an MRAM.

First Embodiment

Figure 1:
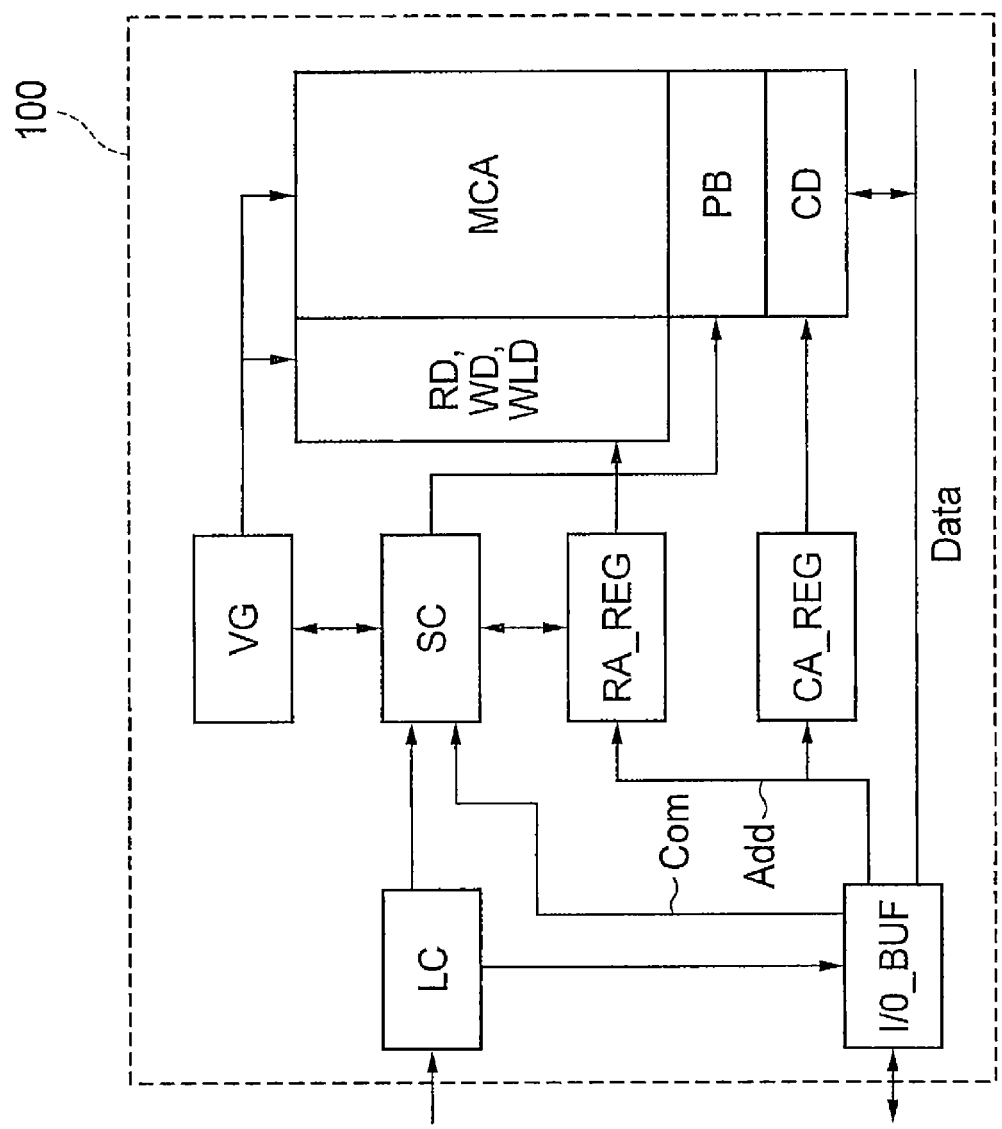
FIG. 1 is a block diagram showing an example of a configuration of a memory 100 according to a first embodiment.

FIG. 1 is a block diagram showing an example of a configuration of a memory 100 according to a first embodiment. The memory 100 includes a memory cell array MCA, a page buffer PB, a column decoder CD, a word line driver WLD (or a write driver WD), a row decoder RD, an internal-voltage generation circuit VG, a sequence controller SC, a logic controller LC, a row address register RA_REG, a column address register CA_REG, and an input/output buffer (hereinafter, "I/O buffer") I/O_BUF. The internal-voltage generation circuit VG includes a step-up circuit that generates a potential VPP higher than a potential of an external power supply VDD using a charge pump circuit, a circuit that generates an internal step-down potential from an external power supply potential using a source-follower step-down transistor or a PMOS feed-back circuit, a BGR (Band-Gap-Reference) circuit serving as a reference-potential generation circuit that generates a constant potential regardless of temperatures and power supply voltages, and the like. While arrows clearly show supply of a step-up potential VPP to the memory cell array MCA, the row decoder RD, and the word line driver WLD (or a write driver WD) in FIG. 1, a step-down potential is also supplied to the page buffer PB, the column decoder CD, the sequence controller SC, the row address register RA_REG, and the column address register CA_REG.

The memory cell array MCA includes a plurality of memory cells MC two-dimensionally arranged in a matrix. The row decoder RD and the word line driver WLD selectively step up a voltage of one of word lines of the memory cell array MCA and drive the selected word line.

The column decoder CD and the page buffer PB read data of a memory cell MC via a selected bit line or bit line pair and temporarily store therein the read data. The column decoder CD and the page buffer PB temporarily store therein write data and write the stored write data to a memory cell MC via a selected bit line or bit line pair. The page buffer PB includes a sense amplifier circuit and a data retention circuit and performs read and write of data in units of pages of the memory cell array MCA. The column decoder CD transfers the read data stored in the page buffer PB to the I/O buffer I/O_BUF with respect to each column. The column decoder CD transfers the write data transferred from the I/O buffer I/O_BUF to the page buffer PB with respect to each column.

The row address register RA_REG receives a row address signal via the I/O buffer I/O_BUF and holds the row address signal therein. The column address register CA_REG receives a column address signal via the I/O buffer I/O_BUF and holds the column address signal therein. The row address register RA_REG and the column address register CA_REG transfer the row address signal and the column address signal (hereinafter, also "address signal Add") to the row decoder RD and the column decoder CD, respectively.

Based on a control signal (hereinafter, also "command Com") such as a chip enable signal, a command enable signal, an address-latch enable signal, a write enable signal, or a read enable signal, the logic controller LC controls input of the command Com or the address signal Add and also controls input/output of data Data (read data or write data). A read operation or a write operation is performed according to the command Com. Upon reception of the command Com, the sequence controller SC executes a sequence control on read, write, or erase.

The internal-voltage generation circuit VG is controlled by the sequence controller SC and generates/supplies predetermined voltages required for various operations. At this time, a control to determine an order in which internal power supplies are activated when an external power supply is activated and an order in which the internal power supplies are deactivated when the external power supply is deactivated is important.

The I/O buffer I/O_BUF outputs the read data from the column decoder CD to outside or transfers the write data from outside to the column decoder CD. The I/O buffer I/O_BUF receives the command Com and the address signal Add.

Figure 2:
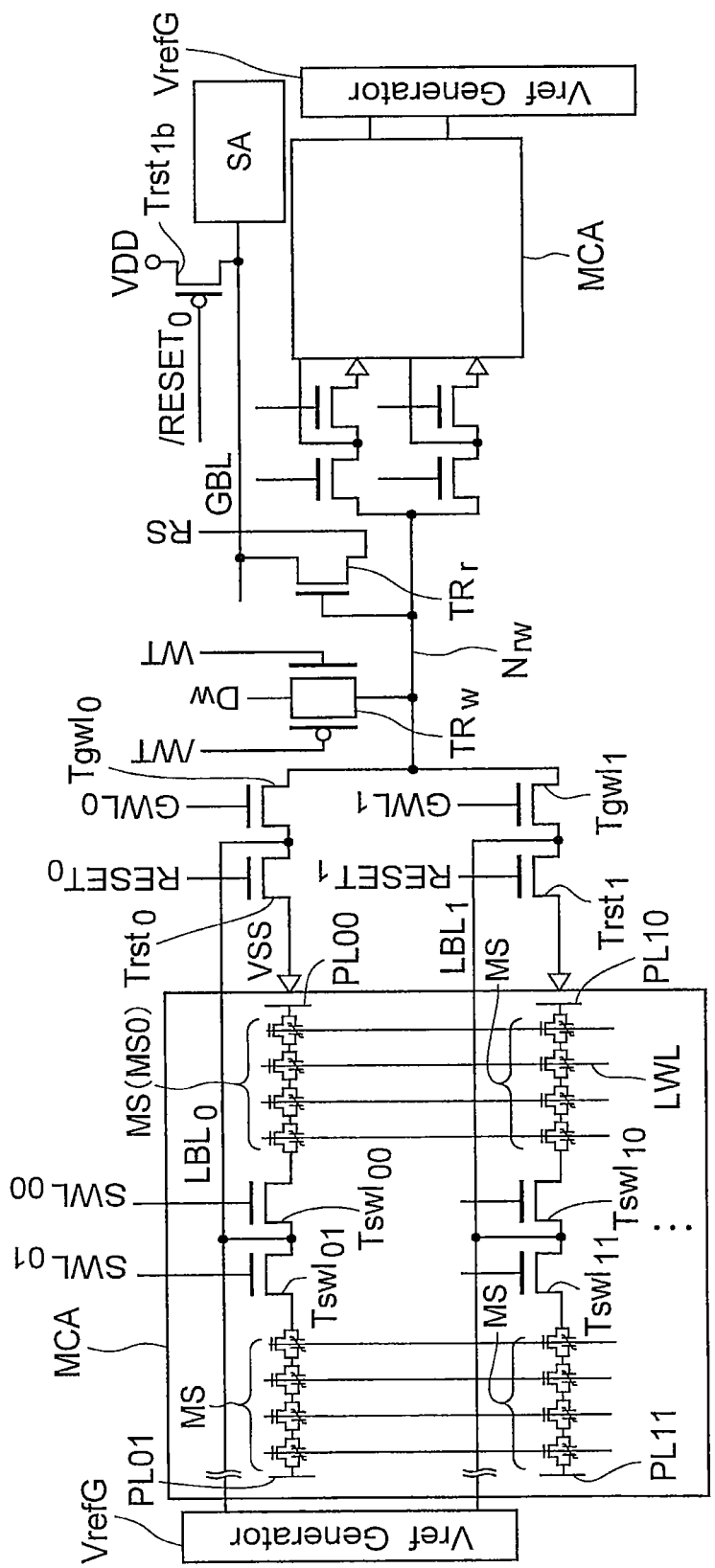
FIG. 2 shows an example of a configuration of the memory cell array and a sense part according to the first embodiment.

FIG. 2 shows an example of a configuration of the memory cell array and a sense part according to the first embodiment. The memory cell array MCA can be, for example, a memory which consists of series connected memory cells each serving as a unit cell having a cell transistor (T) having a source terminal and a drain terminal and a ferroelectric capacitor (C) having opposite ends connected in-between the two terminals, respectively, (hereinafter "Series connected TC unit type ferroelectric RAM").

A plurality of memory cells MC are connected in series to form one of memory string MS. One ends of the memory strings MS are connected to a local bit line LBL0 or LBL1 via select transistors Tswl00 to Tswl11. The other ends of the memory strings MS are connected to plate lines PL00 and PL11, respectively. The memory strings MS are connected to local word lines LWL and can be selectively connected to the local bit line LBL0 or LBL1.

The local bit lines LBL0 and LBL1 serving as first bit lines are connected to a node Nrw via transistors Tgwl0 and Tgwl1, respectively. The transistors Tgwl0 and Tgwl1 are controlled by signals from global word lines GWL0 and GWL1 and can selectively connect the local bit lines LBL0 and LBL1 to the node Nrw, respectively. The local bit lines LBL0 and LBL1 are connected to a low voltage source VSS (supplying a ground potential, for example) via transistors Trst0 and Trst1, respectively. The transistors Trst0 and Trst1 serving as first and second precharge transistors are controlled by signals from reset lines RESET0 and REST1 and can selectively connect the local bit lines LBL0 and LBL1 to the low voltage source VSS, respectively.

The node Nrw is connected to a gate of an N read transistor (first transistor) TRr. A drain of the read transistor TRr is connected to global bit lines GBL serving as second bit lines. A source of the read transistor TRr is connected to a step voltage line RS. When a threshold voltage of the read transistor TRr is Vth, the read transistor TRr is turned on when a voltage between the gate and the source exceeds Vth. That is, the read transistor TRr is turned on when a voltage of the step voltage line RS becomes lower than a voltage (Vnrw−Vth) obtained by subtracting Vth from a voltage (read signal voltage) Vnrw of the node Nrw.

When the read transistor TRr is a P transistor, the drain of the read transistor TRr is connected to the global bit lines GBL and the source of the read transistor TRr is connected to the step voltage line RS. When the threshold voltage of the read transistor TRr is Vth, the read transistor TRr is turned on when a voltage of the step voltage line RS becomes higher than a voltage obtained by adding the absolute value of Vth to a voltage (read signal voltage) of the node Nrw.

The global bit lines GBL are connected to a sense amplifier circuit SA. The global bit lines GBL are connected to a power supply VDD via a transistor Trst1*b*. When the precharge transistor Trst1*b* connects the power supply VDD to the global bit lines GBL, the global bit lines GBL are precharged to a voltage VDD.

In the read operation, the voltage of the step voltage line RS is lowered from VDD in a stepwise manner. When the read transistor TRr is turned on, charges from selected one of the global bit lines GBL precharged to the voltage VDD flow to the step voltage line RS. A timing (or the step voltage line RS at a timing) when the read transistor TRr is turned on depends on the voltage (read signal voltage) of the node Nrw. The timing (or the step voltage line RS at a timing) when the read transistor TRr is turned on can be known by the sense amplifier circuit SA detecting the voltage of the global bit line GBL and storing the detected voltage therein each time the voltage of the step voltage line RS is changed. Detailed configurations and operations of the sense amplifier circuit SA are explained later.

The node Nrw is also connected to a write transistor TRw. The write transistor TRw is turned on to transmit a write signal to the node Nrw at the time of data write. The write operation includes not only write of data from outside but also rewrite of a read signal having once been read.

A reference-voltage generation circuit VrefG is connected to the local bit lines LBL0 and LBL1 and generates a reference voltage Vref to transmit the reference voltage Vref to the local bit lines LBL0 and LBL1. The reference voltage Vref is a medium voltage between a read signal voltage from memory cells MC that store therein data "0" (hereinafter, also "0 cells") and a read signal voltage from memory cells MC that store therein data "1" (hereinafter, also "1 cells"). The configuration of the reference-voltage generation circuit VrefG is not particularly limited as long as the reference voltage Vref can be generated.

The number of the local bit lines connected to the node Nrw, the number of the memory strings MS connected to each of the local bit lines, and the number of the memory cells MC connected to each of the memory strings MS are not limited. A plurality of sets each including the memory cell array MCA, the reference-voltage generation circuit VrefG, the transistors Tgwl0 and Tgwl1, and the transistors Trst0 and Trst1 can be connected in common to the node Nrw. In this case, the sets are not selected at the same time but are selected in different timings, respectively.

Figure 3:
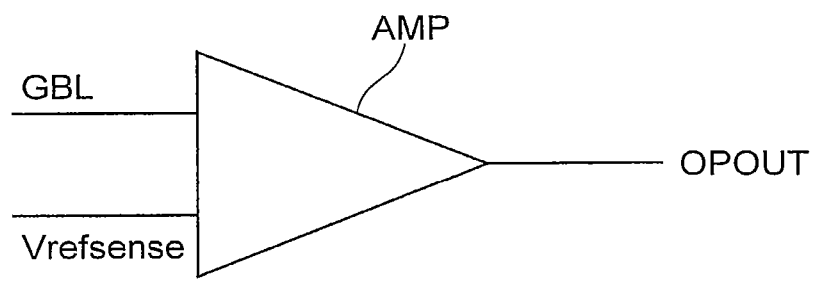
FIG. 3 shows an operational amplifier AMP included in the sense amplifier circuit SA.

FIG. 3 shows an operational amplifier AMP included in the sense amplifier circuit SA. The operational amplifier AMP serving as a comparator receives the voltage of one of the global bit line GBL and a detection reference voltage Vrefsense as inputs, and compares and amplifies a difference between these voltages to output the amplified difference as an output OPOUT. The detection reference voltage Vrefsense is, for example, a medium voltage between a high voltage source VDD and a low voltage source VSS.

Figure 4:
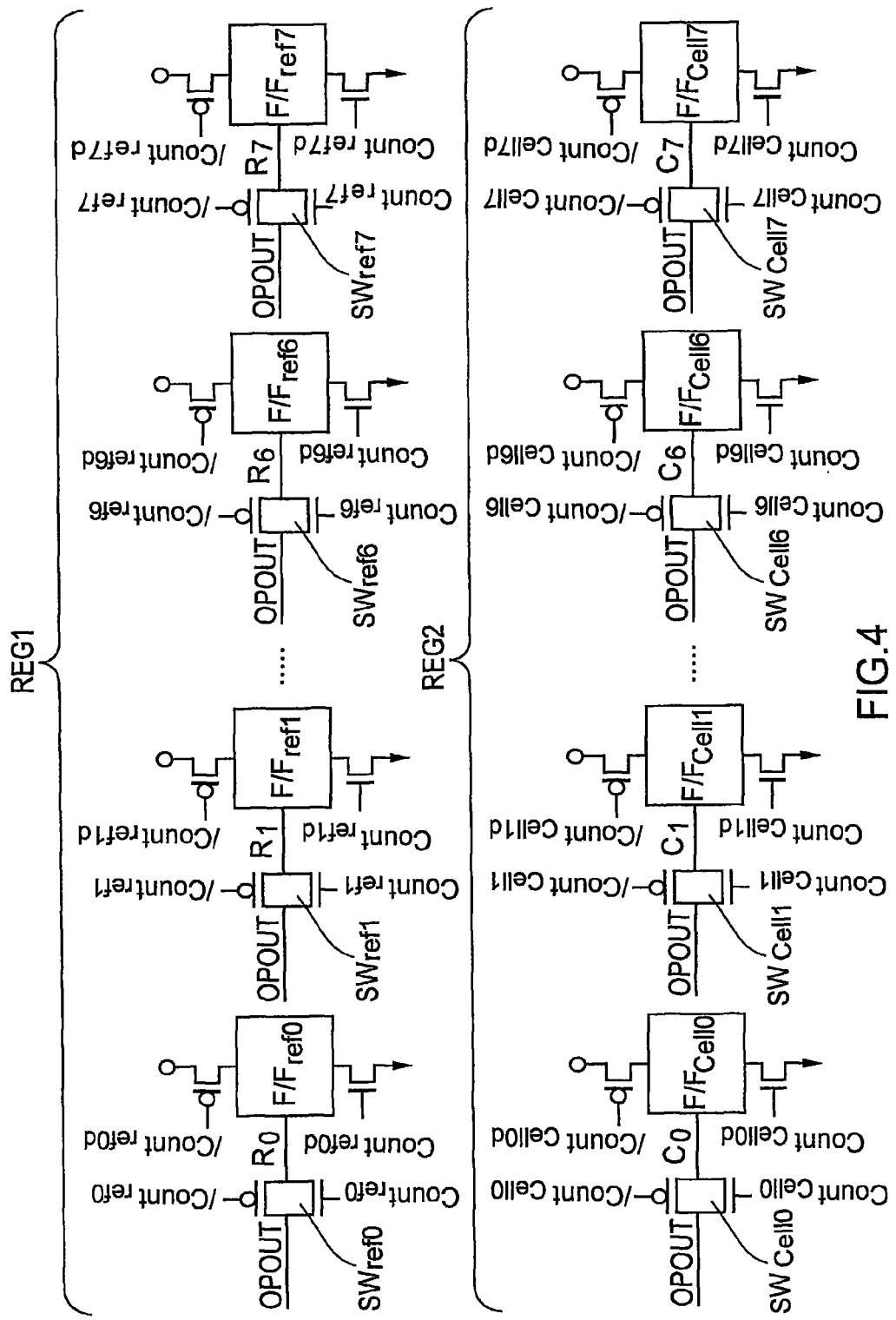
FIG. 4 shows a first register part REG1 and a second register part REG2 included in the sense amplifier circuit SA.

FIG. 4 shows a first register part REG1 and a second register part REG2 included in the sense amplifier circuit SA. The first register part REG1 receives a result of comparison between the reference voltage Vref and the detection reference voltage Vrefsense performed in the operational amplifier AMP as the output OPOUT and stores the comparison result therein. The second register part REG2 receives a result of comparison between the read signal voltage and the detection reference voltage Vrefsense performed in the operational amplifier AMP as the output OPOUT and stores the comparison result therein.

The first register part REG1 includes latch circuits F/Fref0 to F/Fref7 and select switches SWref0 to SWref7. The latch circuits F/Fref0 to F/Fref7 are connected to the output OPOUT of the operational amplifier AMP via the select switches SWref0 to SWref7, respectively.

The select switches SWref0 to SWref7 are controlled by counter signals Countref0 to Countref7 and inversion signals thereof /Countref0 to /Countref7, respectively. The latch circuits F/Fref0 to F/Fref7 are controlled by counter signals Countref0$d$ to Countref7$d$ and inversion signals thereof /Countref0$d$ to /Countref7$d$, respectively.

For example, to select the latch circuit F/Fref0, the counter signal Countref0 is pulse-driven to logic high and then to logic low and the counter signal Countref0$d$ is then set to logic high. The inversion signals /Countref0 and /Countref0$d$ have the opposite logic, respectively. Accordingly, the select switch SWref0 is brought to a conduction state, whereby the output OPOUT of the operational amplifier AMP is connected to the latch circuit F/Fref0 via the select switch SWref0 and is latched. In this way, the latch circuit F/Fref0 can store a logical value of the output OPOUT therein. Operations of other latch circuits F/Fref1 to F/Fref7 can be readily understood from the operations of the latch circuit F/Fref0, and thus explanations thereof will be omitted.

The second register part REG2 includes latch circuits F/Fcell0 to F/Fcell7 and select switches SWcell0 to SWcell7. The latch circuits F/Fcell0 to F/Fcell7 are connected to the output OPOUT of the operational amplifier AMP via the select switches SWcell0 to SWcell7, respectively.

The select switches SWcell0 to SWcell7 are controlled by counter signals Countcell0 to Countcell7 and inversion signals thereof /Countcell0 to /Countcell7, respectively. The latch circuits F/Fcell0 to F/Fcell7 are controlled by counter signals Countcell0$d$ to Countcell7$d$ and inversion signals thereof /Countcell0$d$ to /Countcell7$d$, respectively. Operations of the latch circuits F/Fcell0 to F/Fcell7 can be readily understood from the operations of the latch circuit F/Fref0, and thus explanations thereof will be omitted.

Logical values held in the latch circuits F/Fref0 to F/Fref7 are output from nodes R0 to R7, respectively. Logical values held in the latch circuits F/Fcell0 to F/Fcell7 are output from nodes C0 to C7, respectively.

Figure 5:
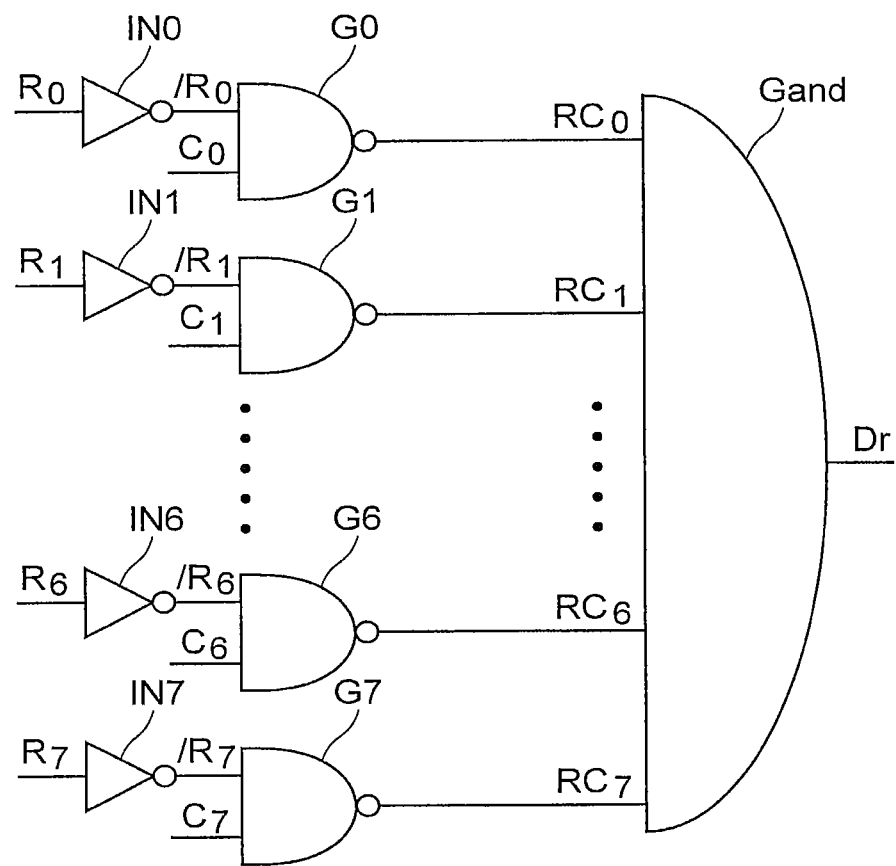
FIG. 5 shows a logic output circuit LG included in the sense amplifier circuit SA.

FIG. 5 shows a logic output circuit LG included in the sense amplifier circuit SA. The logic output circuit LG includes NAND gates G0 to G7 and an AND gate Gand. One inputs of the NAND gates G0 to G7 serving as first logic parts are connected to the nodes R0 to R7 of the latch circuits F/Fref0 to F/Fref7 via inverters IN0 to IN7, respectively. The other inputs of the NAND gates G0 to G7 are connected to the nodes C0 to C7 of the latch circuits F/Fcell0 to F/Fcell7, respectively. Accordingly, the NAND gate G0 receives an inverted signal of latch data of the latch circuit F/Fref0 and a non-inverted signal of latch data of the latch circuit F/Fcell0 as inputs and outputs a result of an NAND operation thereof as a signal RC0. Similarly, the NAND gates G1 to G7 also receive inverted signals of latch data of the latch circuits F/Fref1 to F/Fref7 and non-inverted signals of latch data of the latch circuits F/Fcell1 to F/Fcell7 as inputs and output results of NAND operations thereof as signals RC1 to RC7, respectively.

The AND gate Gand serving as a second logic part receives the signals RC0 to RC7 as inputs and outputs a result of an AND operation thereof as read data Dr.

When the signal of a node Rx (x is an integer from 0 to 7) is logic low and the signal of a node Cx is logic high, the signal RCx becomes logic low. In this case, the AND gate Gand outputs logic low. That is, when there is at least one combination of (signal of node Rx, signal of node Cx)=(logic low, logic high), the read data Dr of the AND gate Gand becomes logic low. In other cases, that is, when all of (signal of node Rx, signal of node Cx) are any of (logic high, logic low), (logic low, logic low), and (logic high, logic high), the signal RCx becomes logic high, and thus the read data Dr of the AND gate Gand becomes logic high.

The combination of (signal of node Rx, signal of node Cx)=(logic low, logic high) occurs when a read signal of the reference voltage has a high logic value and a read signal of a memory cell has a low logic value as explained with reference to FIG. 6. The number of the latch circuits, the number of the NAND gates (that is, the number of bits), and the like in the above configuration of the sense amplifier circuit SA are not particularly limited.

(Read of Reference Voltage)

Figure 6:
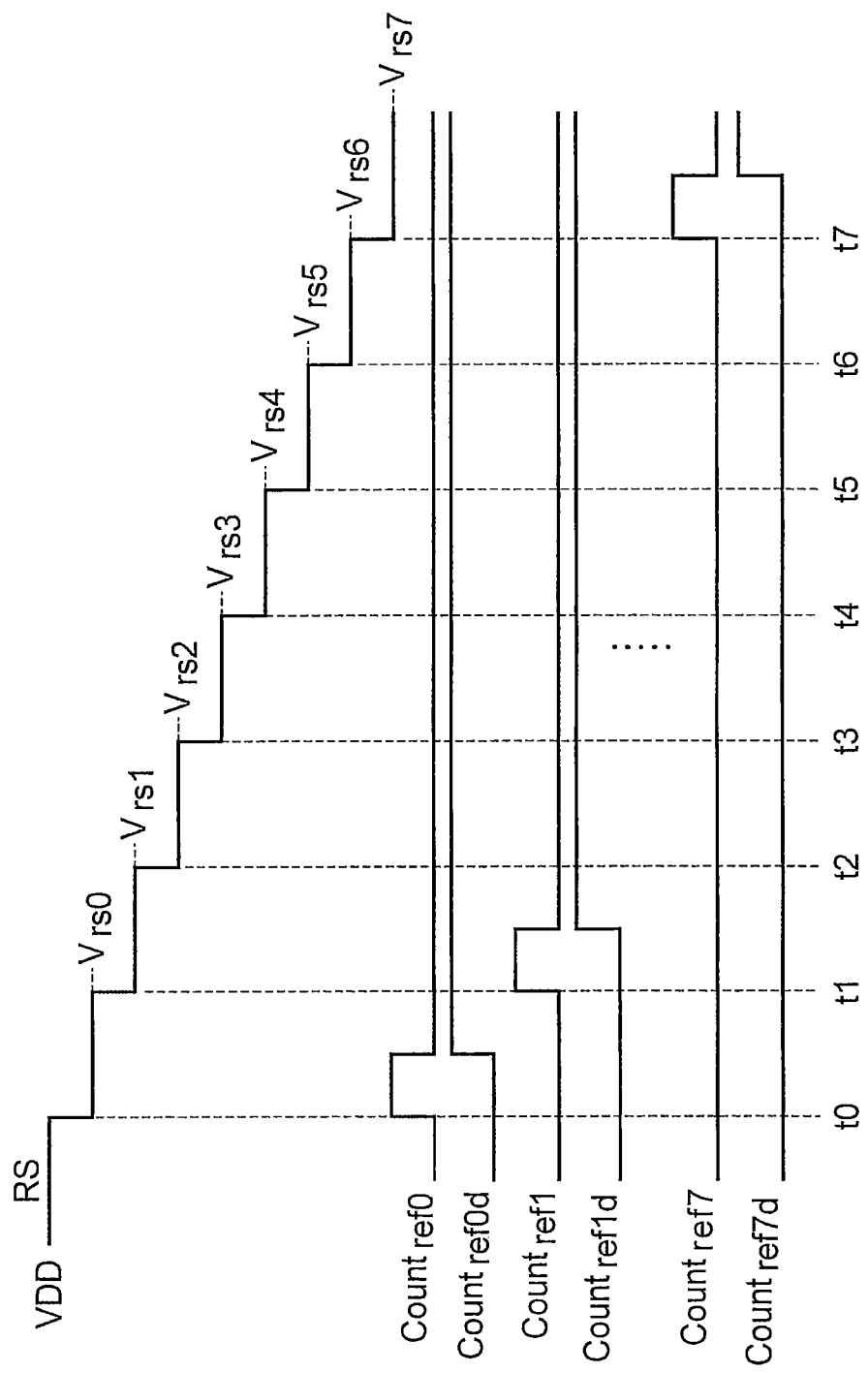
FIG. 6 is a timing chart showing a read operation of the reference voltage Vref.

FIG. 6 is a timing chart showing a read operation of the reference voltage Vref. It is assumed in this case that the read transistor TRr is an N transistor.

First, the reference voltage Vref is read from the reference-voltage generation circuit VrefG shown in FIG. 2 to the node Nrw via a selected local bit line LBL0. The reference voltage Vref is a medium potential between the voltage of the data "0" and the voltage of the data "1". The read transistor TRr receives the reference voltage Vref at the gate. The corresponding global bit line GBL and the local bit line LBL are precharged.

Next, the voltage of the step voltage line RS is lowered from the high-level voltage VDD to Vrs7 in a stepwise manner as shown in FIG. 6. The number of steps and potential differences between adjacent steps can be arbitrarily set. In synchronization with lowering in the voltage of the step voltage line RS, the counter signals Countref0 to Countref7 are driven in turn to high and then to low and the counter signals Countref0$d$ to Countref7$d$ are then raised in turn.

For example, at a time t0, the voltage of the step voltage line RS is set to Vrs0. At that time, the counter signal Countref0 is driven to logic high and then to logic low and the counter signal Countref0$d$ is then raised. This brings the select switch SWref0 shown in FIG. 4 to a conduction state for a predetermined period and, after switch-off, the latch circuit F/Fref0 latches the output OPOUT of the operational amplifier AMP.

The counter signal Countref0$d$ then keeps logic high and the latch circuit F/Fref0 continues to latch the output OPOUT of the operational amplifier AMP of that time.

Subsequently, at a time t1, the voltage of the step voltage line RS is lowered to Vrs1. At that time, the counter signal Countref1 is driven to logic high and then to logic low and the counter signal Countref1$d$ is then raised. This brings the select switch SWref1 in FIG. 4 to a conduction state for a predetermined period and the latch circuit F/Fref1 latches the output OPOUT of the operational amplifier AMP after switch-off.

The counter signal Countref1d then keeps logic high and the latch circuit F/Fref1 continues to latch the output OPOUT of the operational amplifier AMP of that time.

At times t2 to t7, the latch circuits F/Fref2 to F/Fref7 similarly operate in turn. Accordingly, the latch circuits F/Fref2 to F/Fref7 latch the outputs OPOUT of the operational amplifier AMP of times when the voltage of the step voltage line RS is set to Vrs2 to Vrs7, respectively. In this way, the latch circuits F/Fref2 to F/Fref7 store therein the outputs OPOUT of the operational amplifier AMP, respectively, in time series.

When the voltage of the step voltage line RS is lowered gradually as shown in FIG. 6, there is a stage where the voltage of the step voltage line RS becomes lower than a voltage (Vref−Vth) obtained by subtracting Vth from the reference voltage Vref at the node Nrw. That is, when the voltage of the step voltage line RS is lowered gradually, there is a stage where the potential difference between the gate and the source of the read transistor TRr becomes equal to or higher than Vth. At that stage, the read transistor TRr is turned on and the voltage of the precharged global bit line GBL is lowered from the high-level voltage VDD. Because the voltage of the global bit line GBL thus becomes lower than the detection reference voltage Vrefsense, the output OPOUT of the operational amplifier AMP in FIG. 3 becomes logic low.

For example, it is assumed that the output OPOUT of the operational amplifier AMP becomes logic low at a stage (t3) where the voltage of the step voltage line RS is Vrs3. In this case, the output OPOUT of the operational amplifier AMP is logic high during the times from t0 to t2 and the output OPOUT of the operational amplifier AMP is logic low at the time t3 and thereafter. Therefore, the latch circuits F/Fref0 to F/Fref2 of the first register part REG1 latch logic high and the latch circuits F/Fref3 to F/Fref7 latch logic low. That is, the potentials of the nodes R0 to R2 indicate logic high and the potentials of the nodes R3 to R7 indicate logic low.

In this way, as the counter advances, the voltage of the step voltage line RS lowers and, at the times of lowering, the outputs OPOUT of the operational amplifier AMP are latched by the latch circuits F/Fref0 to F/Fref7, respectively. In the beginning, when the voltage of the step voltage line RS is high, the read transistor TRr is in an off-state and the output OPOUT of the operational amplifier AMP keeps logic high. However, as lowering in the voltage of the step voltage line RS progresses, the read transistor TRr is brought to an on-state at a point in time. Charges of the global bit line GBL are extracted at that point in time and then the output OPOUT of the operational amplifier AMP becomes logic low. Therefore, the latch circuit F/Fref0 to a certain latch circuit latch logic high and the next latch circuit to the last latch circuit F/Fref7 latch logic low. In this way, read of the reference voltage Vref is completed.

A read operation of a read signal voltage Vcell then follows after a time tr0.

(Read of Signal Voltage)

Figure 7:
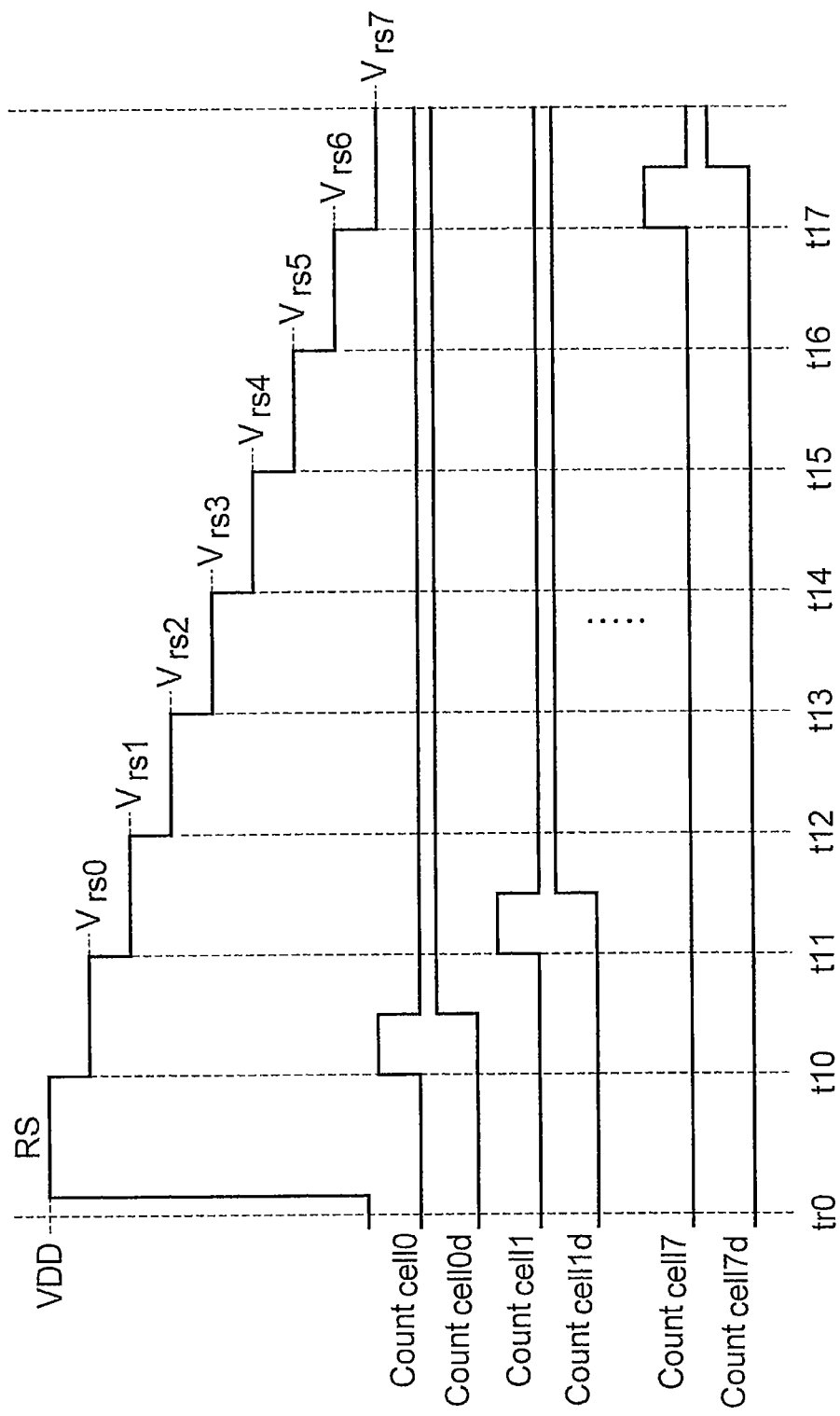
FIG. 7 is a timing chart showing a read operation of a read signal voltage Vcell.

FIG. 7 is a timing chart showing a read operation of a read signal voltage Vcell. The read operation of the read signal voltage Vcell follows the read of the reference voltage Vref shown in FIG. 6. The read signal voltage Vcell is first read from a selected memory cell MC selected from the memory cell array MCA in FIG. 2 to the node Nrw via a selected bit line. The read transistor TRr receives the read signal voltage Vcell at the gate. For example, when the selected memory cell MC is included in a memory string MS0, the global word line GWL0 and the select transistor Tswl00 become selected states, respectively. During the read operation and the write operation, the precharge transistors Trst0 and Trst1, unselected global word lines GWL, and unselected select transistors Tswl are in unselected states, respectively.

Next, the voltage of the step voltage line RS is lowered from the high-level voltage VDD to Vrs7 in a stepwise manner as shown in FIG. 7. The number of steps and potential differences between adjacent steps are the same as those shown in FIG. 6. In synchronization with lowering in the voltage of the step voltage line RS, the counter signals Countcell0 to Countcell7 are pulse-driven from low to high and then to low and the counter signals Countcell0d to Countcell7d are then raised, respectively.

For example, at a time t10, the voltage of the step voltage line RS is set to Vrs0. At that time, the counter signal Countcell0 is driven from logic low to logic high and then to logic low and the counter signal Countcell0d is then raised. This brings the select switch SWcell0 in FIG. 4 to a conduction state for a certain period, whereby the latch circuit F/Fcell0 latches the output OPOUT of the operational amplifier AMP after switch-off.

The counter signal Countcell0d then keeps logic high and the latch circuit F/Fcell0 continues to latch the output OPOUT of the operational amplifier AMP of that time.

Subsequently, at a time t11, the voltage of the step voltage line RS is lowered to Vrs1. At that time, the counter signal Countcell1 is pulse-driven from logic low to logic high and then to logic low and the counter signal Countcell1d is then raised. This brings the select switch SWcell1 in FIG. 4 to a conduction state for a certain period, whereby the latch circuit F/Fcell1 latches the output OPOUT of the operational amplifier AMP after switch-off.

The counter signal Countcell1d then keeps logic high and the latch circuit F/Fcell1 continues to latch the output OPOUT of the operational amplifier AMP of that time.

At times t12 to t17, the latch circuits F/Fcell2 to F/Fcell7 similarly operate in turn. Accordingly, the latch circuits F/Fcell2 to F/Fcell7 latch the outputs OPOUT of the operation amplifier AMP of times when the voltage of the step voltage line RS is set to Vrs2 to Vrs7, respectively. The latch circuits F/Fcell0 to F/Fcell7 thus store therein the outputs OPOUT of the operational amplifier AMP, respectively, in time series.

When the voltage of the step voltage line RS is lowered gradually as shown in FIG. 7, there is a stage where the voltage of the step voltage line RS becomes lower than a voltage (Vcell−Vth) obtained by subtracting Vth from the read signal voltage Vcell at the node Nrw. That is, there is a stage where a potential difference between the gate and the source of the read transistor TRr becomes equal to or larger than Vth when the voltage of the step voltage line RS is lowered gradually. At that stage, the read transistor TRr is turned on and the voltage of the precharged global bit line GBL is lowered from the high-level voltage VDD. Accordingly, the voltage of the global bit line GBL becomes lower than the detection reference voltage Vrefsense, and thus the output OPOUT of the operational amplifier AMP in FIG. 3 becomes logic low.

For example, when a selected memory cell has the data "0", the read signal voltage Vcell is lower than the reference voltage Vref. Therefore, during read of the read signal voltage Vcell, the read transistor TRr is not turned on until the voltage of the step voltage line RS becomes relatively low. It is assumed, for example, that the output OPOUT of the operational amplifier AMP becomes logic low at a stage (t16)

where the voltage of the step voltage line RS is Vrs6. In this case, the output OPOUT of the operational amplifier AMP is logic high at the times from t10 to t15 and the output OPOUT of the operational amplifier AMP is logic low at the time t16 and thereafter. Therefore, the latch circuits F/Fcell0 to F/Fcell5 in the second register part REG2 latch logic high and the latch circuits F/Fcell6 and F/Fcell7 latch logic low. That is, the potentials of the nodes C0 to C5 indicate logic high and the potentials of the nodes C6 and C7 indicate logic low.

On the other hand, for example, when a selected memory cell has the data "1", the read signal voltage Vcell is higher than the reference voltage Vref. Therefore, during read of the read signal voltage Vcell, the read transistor TRr is turned on when the voltage of the step voltage line RS is relatively high. It is assumed, for example, that the output OPOUT of the operational amplifier AMP becomes logic low at a stage (t11) where the voltage of the step voltage line RS is Vrs1. In this case, the output OPOUT of the operational amplifier AMP keeps logic high at the time t10 and the output OPOUT of the operational amplifier AMP keeps logic low at the time t11 and thereafter. Therefore, the latch circuit F/Fcell0 in the second register part REG2 latches logic high and the latch circuits F/Fcell1 to F/Fcell7 latch logic low. That is, the potential of the node C0 indicates logic high and the potentials of the nodes C1 to C7 indicate logic low. In this way, the read of the read signal voltage Vcell of the selected memory cell MC is completed.

(Comparison Operation)

The nodes R0 to R7 of the first register part REG1 and the nodes C0 to C7 of the second register part REG2 are compared with each other with respect to each potential of the step voltage line RS. For example, as described above, when a selected memory cell has the data "0", (R0, C0) is (logic high, logic high) when the voltage of the step voltage line RS is Vres0. When the voltage of the step voltage line RS is Vrs1, (R1, C1) is (logic high, logic high). When the voltage of the step voltage line RS is Vrs2, (R2, C2) is (logic high, logic high). When the voltage of the step voltage line RS is Vrs3, (R3, C3) is (logic low, logic high). When the voltage of the step voltage line RS is Vrs4, (R4, C4) is (logic low, logic high). When the voltage of the step voltage line RS is Vrs5, (R5, C5) is (logic low, logic high). When the voltage of the step voltage line RS is Vrs6, (R6, C6) is (logic low, logic low). When the voltage of the step voltage line RS is Vrs7, (R7, C7) is (logic low, logic low). Among these combinations, there are combinations in which (Rx, Cx) is (logic low, logic high). Therefore, the read data Dr of the AND gate Gand becomes logic low.

Meanwhile, the nodes R0 to R7 of the first register part REG1 and the nodes C0 to C7 of the second register part REG2 are compared with each other with respect to each potential of the step voltage line RS in the case where a selected memory cell has the data "1", for example, as described above. When the voltage of the step voltage line RS is Vrs0, (R0, C0) is (logic high, logic high). When the voltage of the step voltage line RS is Vrs1, (R1, C1) is (logic high, logic low). When the voltage of the step voltage line RS is Vrs2, (R2, C2) is (logic high, logic low). When the voltage of the step voltage line RS is Vrs3, (R3, C3) is (logic low, logic low). When the voltage of the step voltage line RS is Vrs4, (R4, C4) is (logic low, logic low). When the voltage of the step voltage line RS is Vrs5, (R5, C5) is (logic low, logic low). When the voltage of the step voltage line RS is Vrs6, (R6, C6) is (logic low, logic low). When the voltage of the step voltage line RS is Vrs7, (R7, C7) is (logic low, logic low). Among these combinations, there is no combination in which (Rx, Cx) is (logic low, logic high). Therefore, the read data Dr of the AND gate Gand becomes logic high.

In this way, the sense simplifier circuit SA according to the first embodiment can detect the data "0" and the data "1".

As described above, the reference voltage Vref is set higher than the read operation voltage for the data "0". Therefore, when the reference voltage Vref is read to the gate of the read transistor TRr in a case where the step voltage line RS is at a certain voltage, the read transistor TRr is turned on, whereby charges of the global bit line GBL are extracted, and thus the output OPOUT becomes logic low. On the other hand, when the read operation voltage for the data "0" is read from a selected memory cell MC to the gate of the read transistor TRr in a case where the step voltage line RS is at the same voltage, the read transistor TRr keeps the off-state, whereby charges of the global bit line GBL are not extracted, and thus the output OPOUT remains logic high. As a result, there is a case where (Rx, Cx) is (logic low, logic high) and accordingly the read data Dr of the AND gate Gand becomes logic low.

The reference voltage Vref is set lower than the read operation voltage for the data "1". Accordingly, when the read operation voltage for the data "1" is read from a selected memory cell MC to the gate of the read transistor TRr in a case where the step voltage line RS is at the same voltage, the read transistor TRr becomes the on-state, whereby charges of the global bit line GBL are extracted, and thus the output OPOUT becomes logic low. As a result, there is no case where (Rx, Cx) is (logic low, logic high) and accordingly the read data Dr of the AND gate Gand becomes logic high. In this way, the sense amplifier circuit SA according to the first embodiment can detect the data "0" and the data "1".

(Write Operation)

Figure 8:
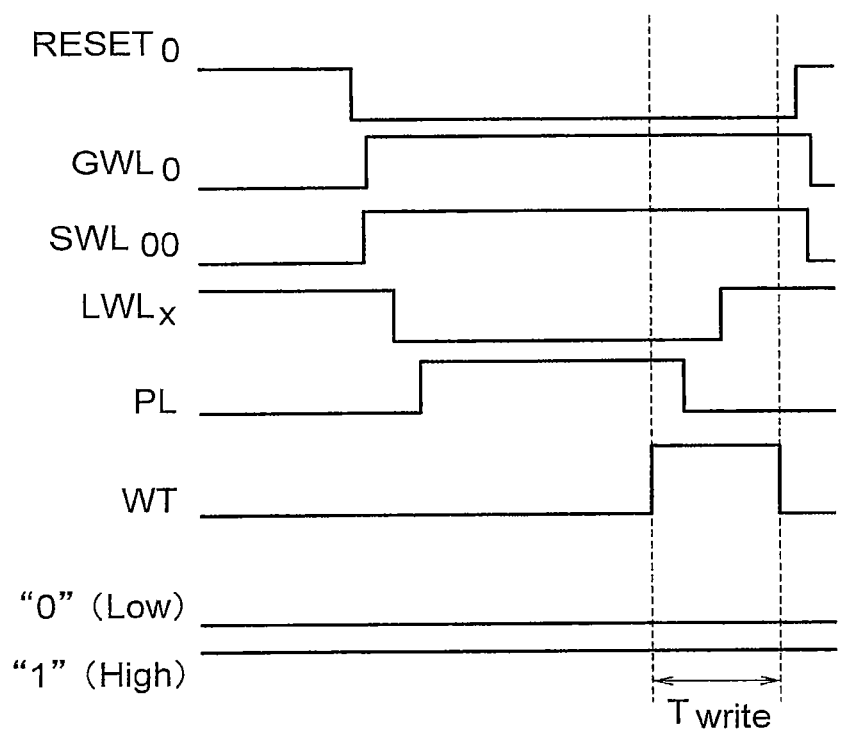
FIG. 8 is a timing chart showing the write operation.

FIG. 8 is a timing chart showing the write operation. FIG. 8 shows an operation of rewiring data of the same logic as that of a read signal. That is, an operation in a case where the data "0" is rewritten after the data "0" is read or a case where the data "1" is rewritten after the data "1" is read is shown.

In this case, the read data Dr in FIG. 5 is input to the write transistor TRw in FIG. 2 as the write data Dw. A selected global bit line GBL0 and a selected signal line SWL00 are logic high and a signal RESET0 is logic low.

Next, when a write signal WT becomes logic high and an inversion signal thereof /WT becomes logic low in a period Twrite shown in FIG. 8, the write transistor TRw in FIG. 2 is turned on, whereby the read data Dr is transmitted as the write data Dw to the node Nrw.

In the period Twrite, the corresponding plate line PL is changed from logic high to logic low. A selected local word line LWL0 is then changed from logic low to logic high. Accordingly, a potential difference between the node Nrw and the plate line PL is applied to the selected memory cell MC, whereby the read data Dr is rewritten to the selected memory cell MC. Unselected local word lines LWL keep logic high.

The global word line GWL0 and the selected signal line SWL00 then fall, thereby ending the write.

When data (a write signal voltage) from outside is to be written, it suffices that external data received from an input/output circuit is input to the write transistor TRw as the write data Dw.

According to the first embodiment, the reference voltage and the read signal voltage are input to the gate of the common read transistor TRr and are detected via a common global bit line GBL. That is, the reference voltage and the read signal voltage are amplified by a common single read transistor TRr. Therefore, the memory according to the first embodiment can read data accurately even when variations in the characteristics of pair transistors that constitute the sense amplifier circuit SA or the like are increased due to downscaling.

When the read transistor TRr is a P transistor, it suffices to gradually increase the voltage of the step voltage line RS. Assuming that the threshold voltage of the read transistor TRr is Vth, the read transistor TRr is turned on when the voltage of the step voltage line RS becomes higher than a voltage obtained by adding the absolute value of Vth to the voltage (the read signal voltage) of the node Nrw. Other operations of the sense amplifier circuit SA are identical to those in the case where the read transistor TRr is an N transistor. Therefore, even when the read transistor TRr is a P transistor, the memory according to the first embodiment can achieve functions and effects identical to those of the case where the read transistor TRr is an N transistor.

Second Embodiment

Figure 9:
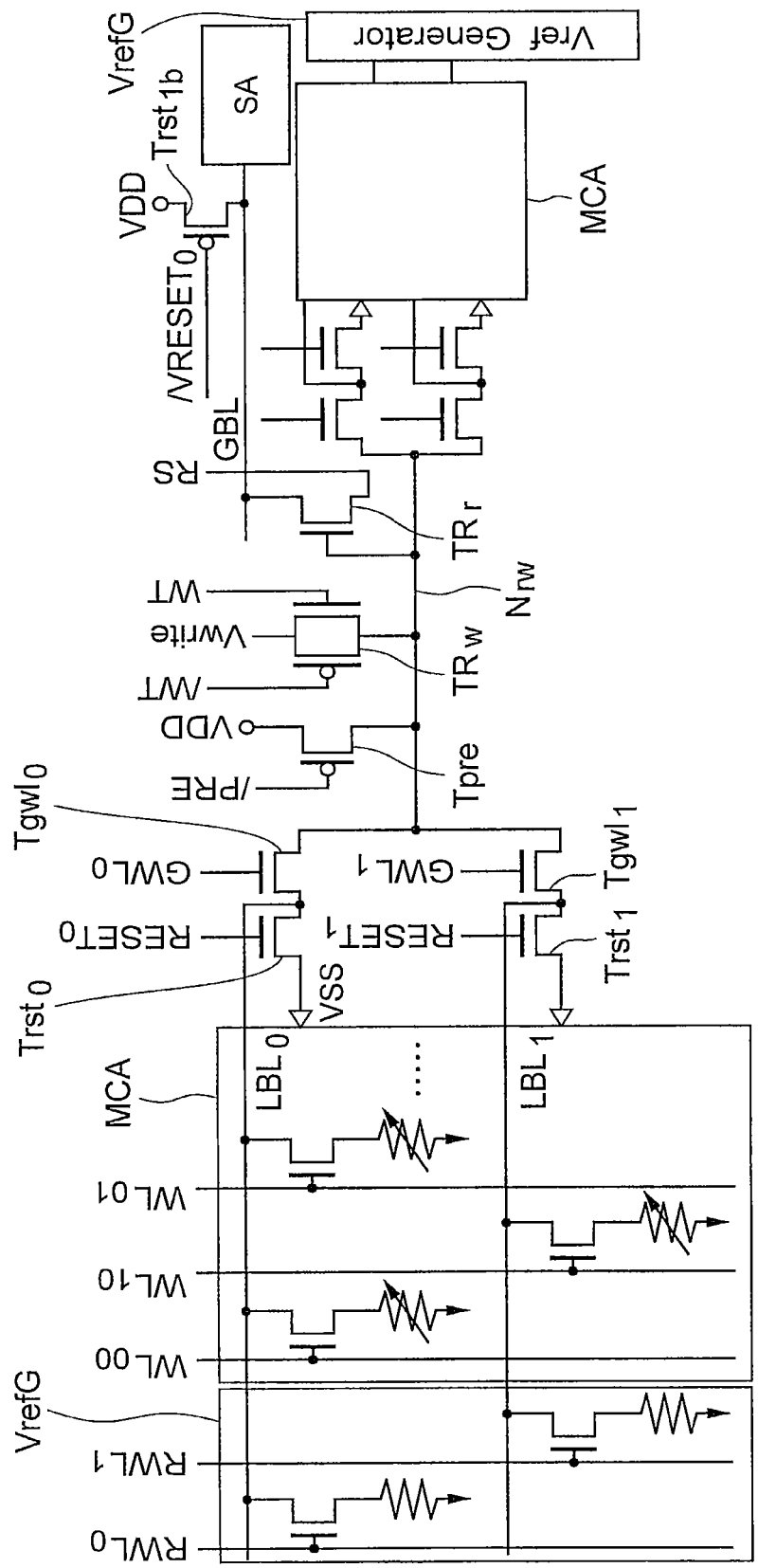
FIG. 9 shows a configuration example of a memory cell array and a sense part according to a second embodiment.

FIG. 9 shows a configuration example of a memory cell array and a sense part according to a second embodiment. The memory cell array MCA is, for example, a ReRAM, a PCM, an iPCM, or an MRAM. Because these memories are capable of read without destroying data (capable of nondestructive read), the read signal is not rewritten. In the second embodiment, a precharge transistor Tpre is connected between the high voltage source VDD and the node Nrw. A precharge potential does not need to be a potential of the external power supply VDD and can be a potential of an internal step-down power supply or a power supply potential internally stepped-up. Other configurations of the second embodiment can be identical to corresponding configurations of the first embodiment. While the example where charges are read from a memory cell to increase the potential of a bit line has been described in the first embodiment, the second embodiment adopts a configuration in which a bit line is precharged and a potential obtained by extracting charges from the bit line for a certain period is compared.

Figure 10:
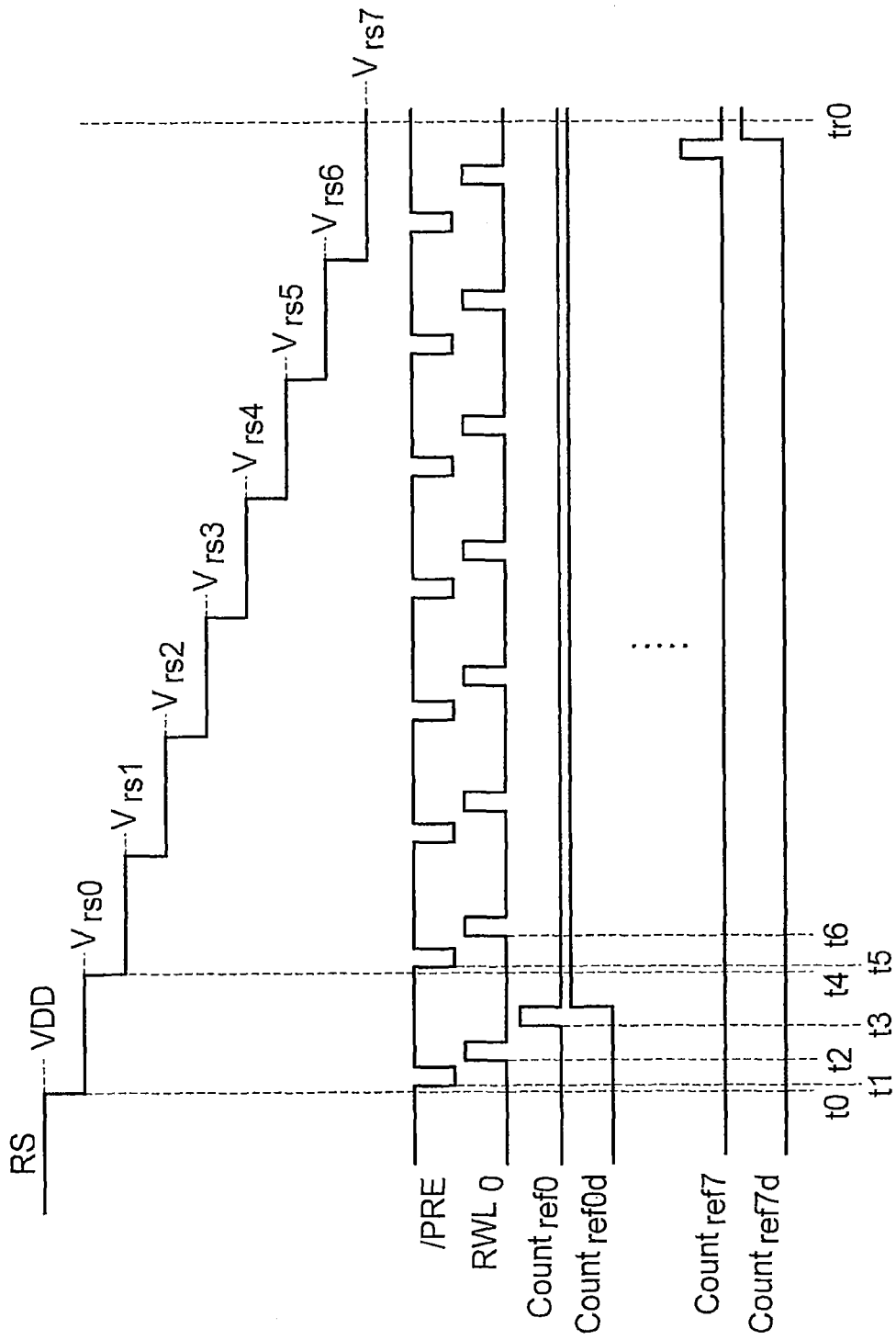
FIG. 10 is a timing chart showing a generation operation of the reference voltage Vref.

FIG. 10 is a timing chart showing a generation operation of the reference voltage Vref.
(Read of Reference Voltage)

Reference word lines RWL are first raised for a certain period in the reference-voltage generation circuit VrefG in FIG. 9 to extract charges from the local bit lines LBL. In this case, resistors in the reference-voltage generation circuit VrefG are set at a medium value between a resistance of the "1" state and a resistance of the "0" state of memory cells MC in the memory cell array MCA. Therefore, when the signal RWL is raised for a certain period, the charges are extracted from the local bit lines LBL and the potential has a medium value between a value in a case where high-resistance memory cells in the "1" state are brought to conduction and charges are extracted therefrom and a value in a case where low-resistance memory cells in the "0" state are brought conduction and charges are extracted therefrom.

The read transistor TRr receives the reference voltage Vref generated in this way at the gate. The corresponding global bit line GBL and the local bit line LBL0 are precharged each time the potential of the step voltage line RS is changed. In the embodiment, the precharge operation is performed at each time the potential of the step voltage line RS is changed. However, only an initial precharge operation may be performed initially in a generation operation of the Vref, because completion of the generation operation can be detected at the time when extracting charges from the local bit lines LBL after the initial precharge operation.

The voltage of the step voltage line RS is lowered from the high-level voltage VDD to Vrs7 in a stepwise manner. In synchronization with lowering in the voltage of the step voltage line RS, a precharge signal /PRE is raised in a pulsed manner and then a signal RWL0 of one of the reference word lines RWL is raised in a pulsed manner. In synchronization with lowering in the voltage of the step voltage line RS, the counter signals Countref0 to Countref7 and Countref0d to Countref7d are driven.

Falling of the precharge signal /PRE in a pulsed manner causes the node Nrw and the selected local bit line LBL0 to be precharged. Charges previously stored are extracted from the reference-voltage generation circuit VrefG at the time of rising of a reference word line RWLx. When the counter signals Countref0 to Countref7 and Countref0d to Countref7d are driven, the latch circuits F/Fref0 to F/Fref7 are driven. Operations of the latch circuits F/Fref0 to F/Fref7 are as explained in FIG. 6, and thus detailed explanations thereof will be omitted.

For example, at a time t0 in FIG. 10, the voltage of the step voltage line RS is set to Vrs0. At a time t1, the precharge signal /PRE falls in a pulsed manner, whereby the node Nrw and the selected local bit line LBL0 are precharged.

Subsequently, at a time t2, the reference word line RWL0 is raised. This causes the previously-stored charges to be extracted from the reference-voltage generation circuit VrefG. The amount of charges to be extracted at that time is the amount of charges corresponding to the reference voltage Vref.

Next, at a time t3, the counter signal Countref0 is pulse-driven and then the counter signal Countref0d is brought to logic high. Accordingly, the latch circuit F/Fref0 in FIG. 4 latches the output OPOUT of the operational amplifier AMP.

At a time t4, the voltage of the step voltage line RS is set to Vrs1. At times from t5 to t6, the operation performed at the times from t1 to t2 is repeated. The counter signal Countref1 is then pulse-driven and then the counter signal Countref1d is brought to logic high. Accordingly, the latch circuit F/Fref1 in FIG. 4 latches the output OPOUT of the operational amplifier AMP.

Identical operations are thereafter performed, whereby the latch circuits F/Fref2 to F/Fref7 latch the outputs OPOUT of the operational amplifier AMP of times when the voltage of the step voltage line RS is Vrs2 to Vrs7, respectively. In this way, the latch circuits F/Fref0 to F/Fref7 store therein the outputs OPOUT of the operational amplifier AMP corresponding to the voltages Vrs0 to Vrs7 of the step voltage line RS, respectively, in time series.

After a time tr0, a read operation of a read signal voltage follows.
(Read of Signal Voltage)

Figure 11:
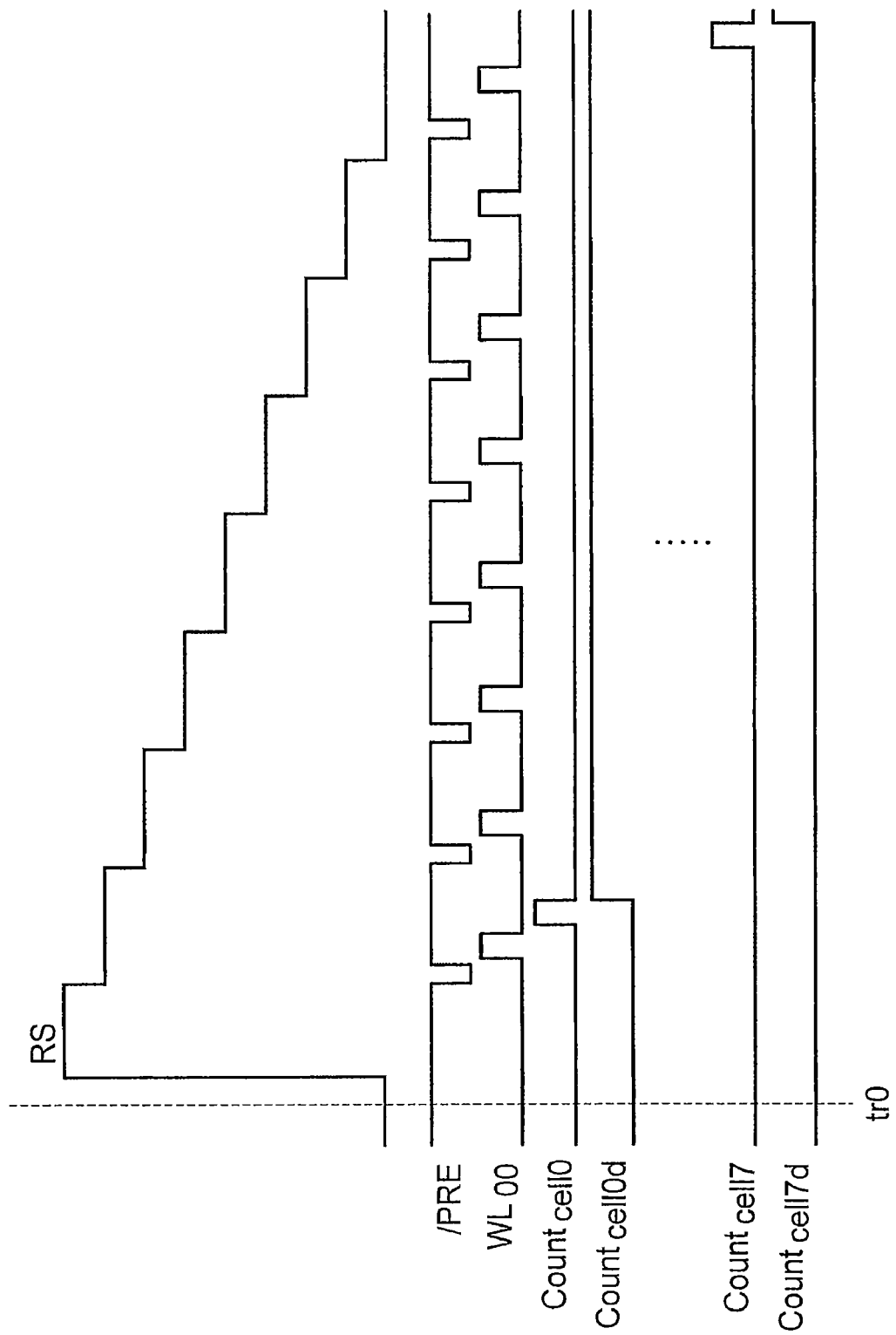
FIG. 11 is a timing chart showing a read operation of a read signal voltage.

FIG. 11 is a timing chart showing a read operation of a read signal voltage. At the time of reading a read signal voltage, a selected word line WL connected to a selected memory cell MC is driven instead of the reference word line RWLx. The counter signals Countcell0 to Countcell7 and Countcell0d to Countcell7d are driven instead of the counter signals Countref0 to Countref7 and Countref0d to Countref7d. Other signal operations shown in FIG. 11 can be identical to those of corresponding signal operations shown in FIG. 10. Accordingly, the latch circuits F/Fcell0 to F/Fcell7 store therein the outputs OPOUT of the operational amplifier AMP corresponding to the voltages Vrs0 to Vrs7 of the step voltage line RS, respectively, in time series.

When the selected memory cell MC is in a high-resistance state (data "1"), not so many charges of the node Nrw are extracted. When the selected memory cell MC is in a low-resistance state (data "0"), many of the charges of the node Nrw are extracted. Therefore, in the same manner as the comparison operation of the first embodiment, the sense amplifier circuit SA can detect the data "0" and the data "1".

Read of the reference voltage Vref and read of a signal voltage can be continuously performed each time the potential of the step voltage line RS is changed. For example, when the potential of the step voltage line RS is Vrs0, read of the reference voltage Vref is performed and, after precharge is performed, read of a signal voltage is performed with no break. Results thereof are latched by the latch circuits F/Fref0 and F/Fcell0, respectively. The potential of the step voltage line RS is then lowered to Vrs1. Read of the reference voltage Vref is performed after precharge is performed and then read of a signal voltage is performed with no break after precharge is performed. Results thereof are latched by the latch circuits F/Fref1 and F/Fcell1, respectively. Such an operation is repeatedly performed, whereby the first and second register parts REG1 and REG2 can latch the outputs OPOUT corresponding to the reference voltage and the signal voltage, respectively, in time series and the sense amplifier circuit SA can detect the data "0" and the data "1".

(Write Driver)

Figure 12:
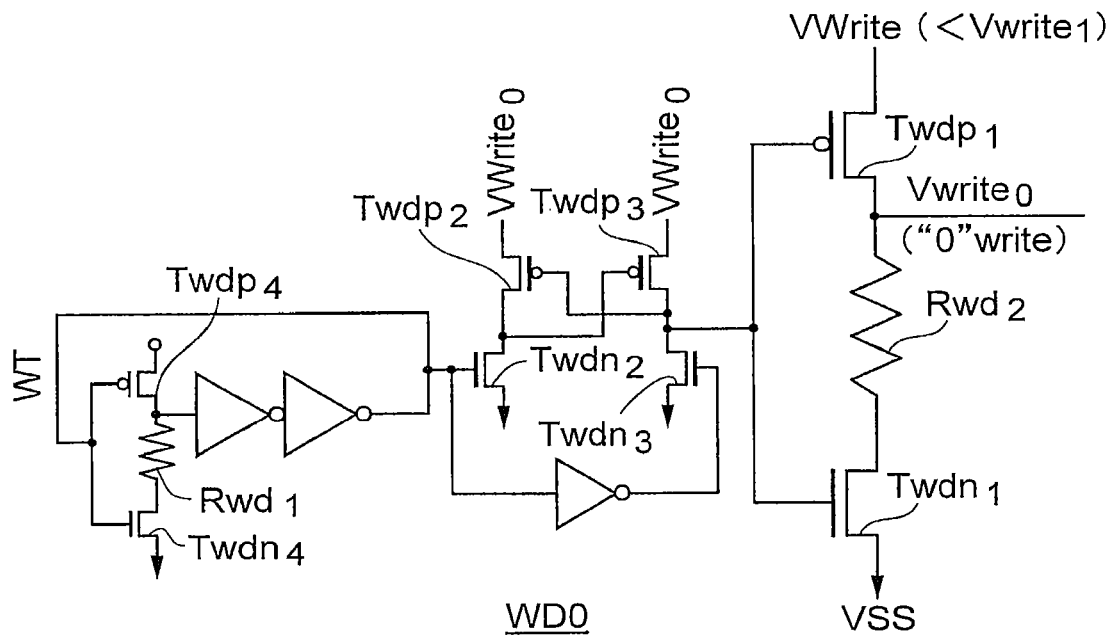
FIG. 12 is a circuit diagram showing a configuration example of a write driver WD0 in a low-resistance state (set state) (data "0")

FIG. 12 is a circuit diagram showing a configuration example of a write driver WD0 in a low-resistance state (set state) (data "0"). The write driver WD0 applies a write voltage Vwrite0 of the data "0" to the node Nrw via the write transistor TRw in FIG. 9.

The write driver WD0 includes resistors Rwd1 and Rwd2, N transistors Twdn1 to Twdn4, and P transistors Twdp1 to Twdp4. The resistor Rwd1 functions as a delay element when the write voltage Vwrite0 is to be raised. The resistor Rwd2 functions as a delay element for gradually lower the write voltage Vwrite0.

Figure 13:
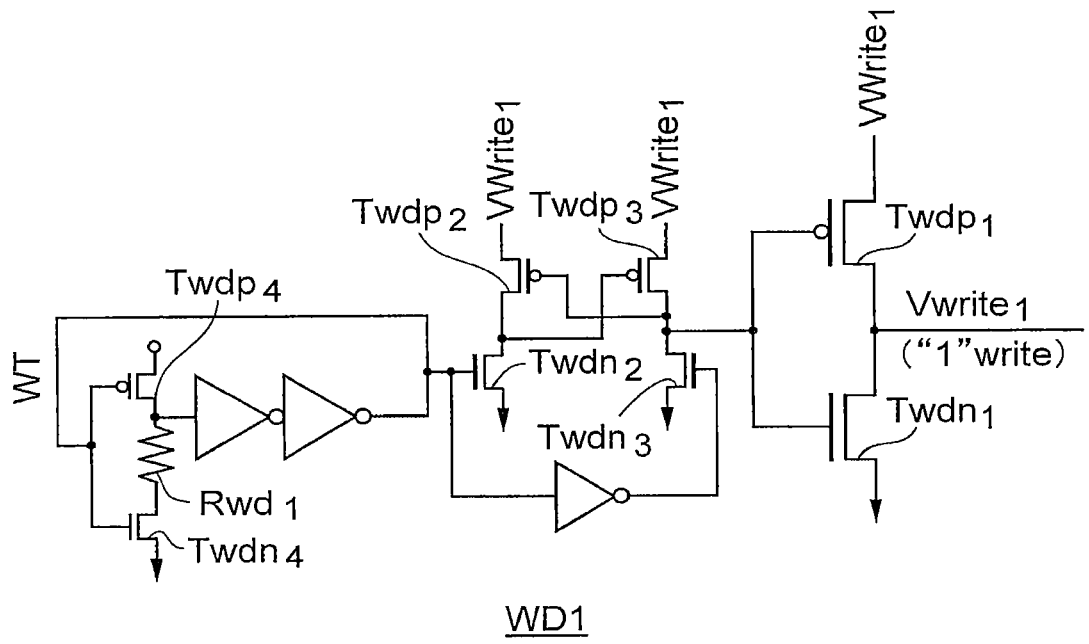
FIG. 13 is a circuit diagram showing a configuration example of a write driver WD1 in a high-resistance state (reset state) (data "1")

FIG. 13 is a circuit diagram showing a configuration example of a write driver WD1 in a high-resistance state (reset state) (data "1"). The write driver WD1 applies a write voltage Vwrite1 of the data "1" to the node Nrw via the write transistor TRw in FIG. 9. The write voltage Vwrite1 is higher than the write voltage Vwrite0.

The write driver WD1 is different from the write driver WD0 in not having the resistor Rwd2. Other configurations of the write driver WD1 can be identical to corresponding configurations of the write driver WD0. Because the write driver WD1 does not have the resistor Rwd2, the write driver WD1 lowers the write voltage Vwrite1 more steeply.

(Write Operation)

Figure 14:
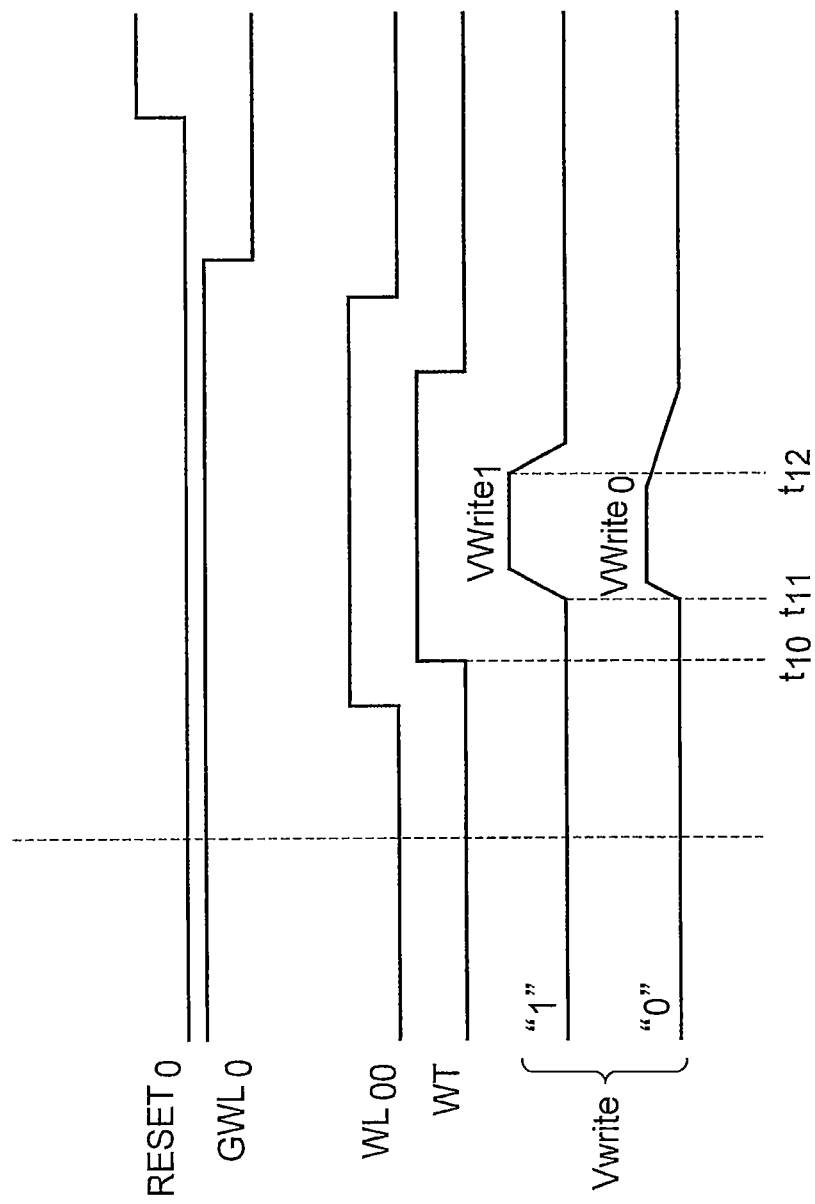
FIG. 14 is a timing chart showing a write operation.

FIG. 14 is a timing chart showing a write operation. FIG. 14 shows an operation of writing data from outside. In the write operation, a reset signal RESET0 falls and the global word line GWL0 and a word line WL00 rise. Accordingly, a memory cell MC connected to the word line WL00 and the local bit line LBL0 is selected.

Subsequently, at a time t10, a signal WT rises. Accordingly, the write voltages Vwrite start rising at a time t11. When the data "0" is to be written, the write driver WD0 shown in FIG. 12 applies the write voltage Vwrite0 to the node Nrw. When the data "1" to be written, the write driver WD1 shown in FIG. 13 applies the write voltage Vwrite1 to the node Nrw. At that time, because the write drivers WD0 and WD1 have the resistors Rwd1, respectively, the write voltages Vwrite are raised with a certain delay.

Next, at a time t12, the write voltages Vwrite are fallen. In this case, because the write driver WD0 shown in FIG. 12 has the resistor Rwd2, the write voltage Vwrite0 is gradually fallen with a delay. On the other hand, the write driver WD1 shown in FIG. 13 does not have the resistor Rwd2, the write voltage Vwrite1 is fallen steeply.

When the write voltage Vwrite is fallen gradually with a delay as by the write driver WD0 at the time of writing the data "0", quench of the iPCM can be handled.

Third Embodiment

Figure 15:
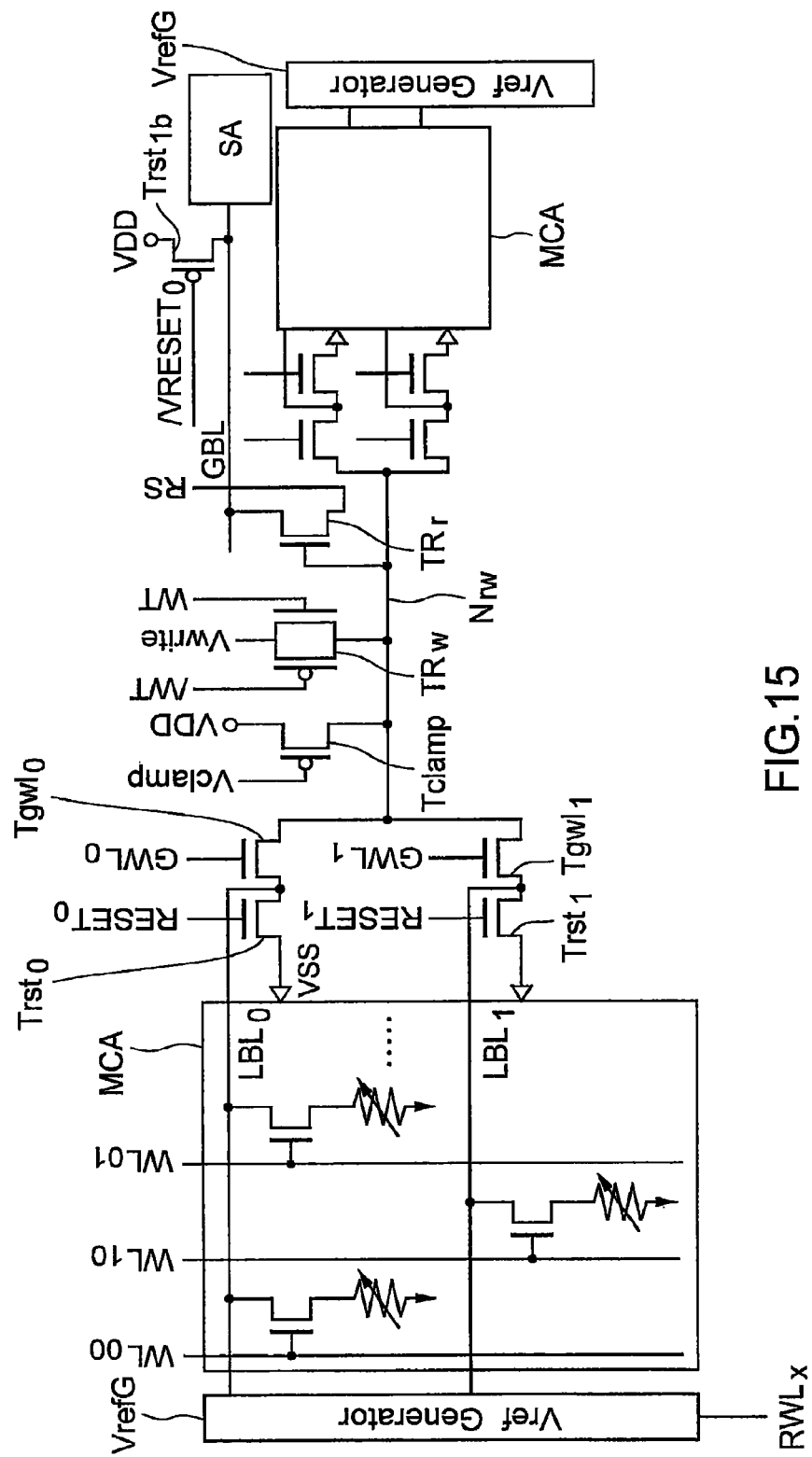
FIG. 15 shows a configuration example of a memory cell array and a sense part according to a third embodiment.

FIG. 15 shows a configuration example of a memory cell array and a sense part according to a third embodiment. The memory cell array MCA is, for example, a ReRAM, a PCM, an iPCM, an MRAM, an NAND flash memory, or a FeNAND as in the second embodiment. In the second embodiment, data is detected based on a voltage obtained after charges are extracted from precharged local bit line LBL and global bit line GBL. In the third embodiment, while a current is continuously flowed to memory cells MC via a clamp transistor Tclamp, a voltage of a local bit line LBL that is brought to an equilibrium state during that period is detected.

Therefore, the memory according to the third embodiment includes the clamp transistor Tclamp instead of the precharge transistor Tpre. Other configurations of the third embodiment can be identical to corresponding configurations of the second embodiment.

Figure 16:
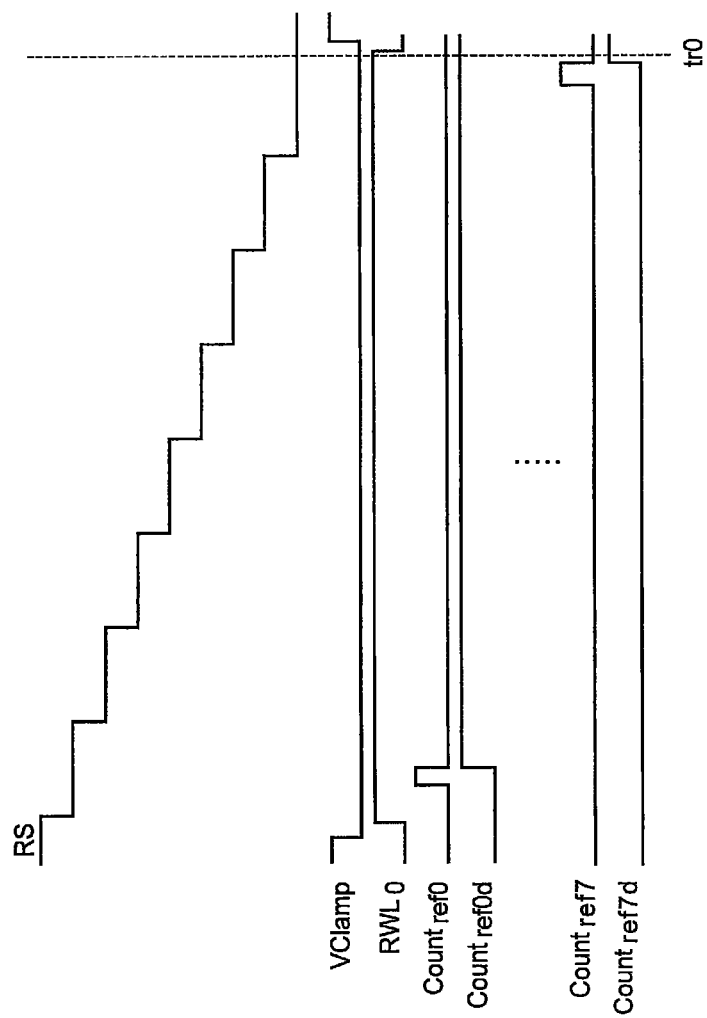
FIG. 16 is a timing chart showing a read operation of the reference voltage Vref.

FIG. 16 is a timing chart showing a read operation of the reference voltage Vref. In the second embodiment, the precharge operation and the charge extraction operation are repeated each time the voltage of the step voltage line RS is changed. In the third embodiment, the clamp transistor Tclamp continuously flows a current to a selected memory cell during read. Therefore, as shown in FIG. 16, a clamp signal Vclamp controlling the clamp transistor Tclamp is continuously input to a gate voltage to supply a potential to the source during the read operation. As a result, the reference word line RWL0 is also continuously raised during a reference-potential generation operation. Other parts of the read operation of the reference voltage according to the third embodiment can be identical to corresponding ones according to the second embodiment.

Figure 17:
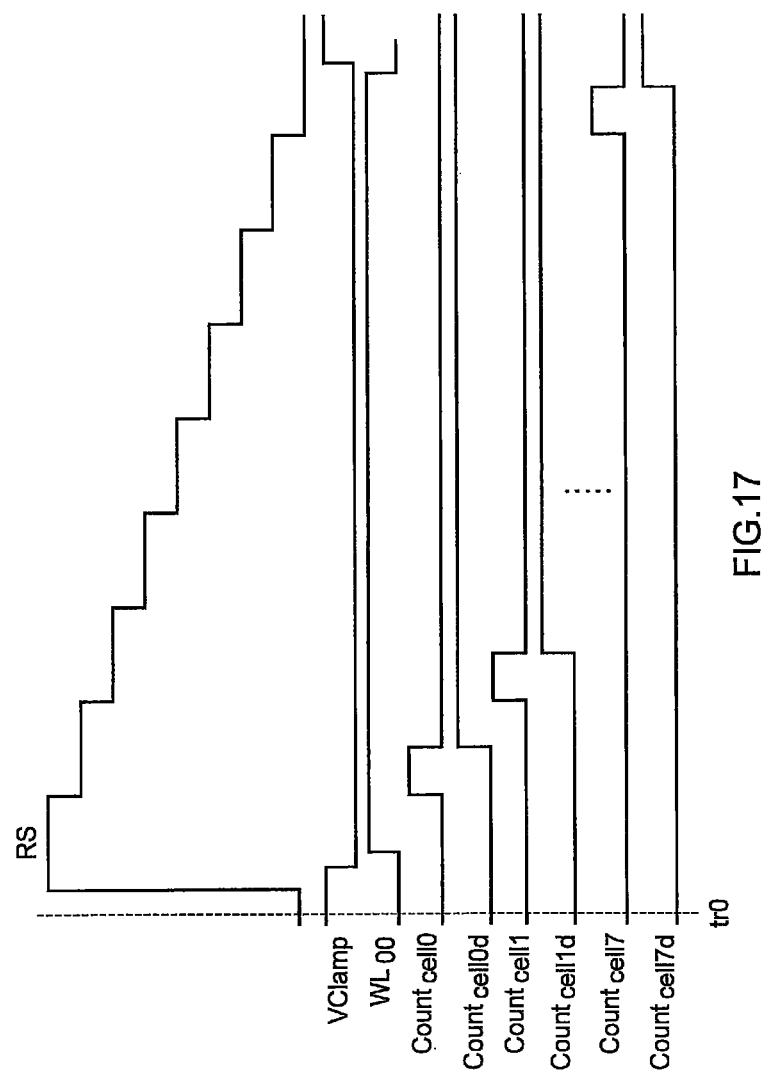
FIG. 17 is a timing chart showing a read operation of a signal voltage of a selected memory cell.

FIG. 17 is a timing chart showing a read operation of a signal voltage of a selected memory cell. In the third embodiment, also in the read operation of a signal voltage, the clamp transistor Tclamp continuously flows a current to the selected memory cell during read. Therefore, as shown in FIG. 17, the clamp signal Vclamp controlling the clamp transistor Tclamp is input to the gate voltage continuously during the reference-potential generation operation. As a result, the selected word line WL00 is also raised continuously during the read operation. Other parts of the read operation of the signal voltage according to the third embodiment can be identical to corresponding ones according to the second embodiment.

As described above, with respect to each of the reference voltage and the signal voltage, the sense amplifier circuit SA receives an output of the corresponding global bit line GBL during a period in which the clamp transistor Tclamp flows a current to a selected memory cell via the local bit line LBL0. The sense amplifier circuit SA can detect a logical value of the signal voltage by comparing the register parts REG1 and REG2 corresponding to the reference voltage and the signal voltage, respectively, with each other. Therefore, the third embodiment can also achieve effects identical to those of first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a memory cell array comprising a plurality of memory cells;
first bit lines which transmit read signal voltages from the memory cells;
a first transistor having a gate connected to the first bit lines;
a second bit line connected to one of a drain and a source of the first transistor;
a step voltage line connected to the other one of the drain and the source of the first transistor to apply a step voltage changing in a stepwise manner to the first transistor at a time of reading;
a reference-voltage generator which generates a reference voltage; and
a sense part connected to the second bit lines to receive the read signal voltages and the reference voltage.

2. The device of claim 1, wherein
the sense part comprises:
a comparator which compares a voltage of selected one of the second bit lines with a detection reference voltage;
a first register part which stores therein a result of comparison between the reference voltage and the detection reference voltage each time the step voltage changes;
a second register part which stores therein a result of comparison between the voltage of the selected one of the second bit lines and the detection reference voltage each time the step voltage changes; and
a logic output part which outputs a logical value of the read signal voltage based on the comparison results stored in the first and second register parts.

3. The device of claim 2, wherein the first and second register parts store therein the comparison results in time series.

4. The device of claim 2, wherein
the logic output part comprises:
a first logic part which compares the comparison results of the first register part with the comparison results of the second register part at levels of the step voltage, respectively; and
a second logic part which receives outputs from the first logic part at the levels of the step voltage, respectively, and outputs a logical value of the read signal voltage.

5. The device of claim 3, wherein
the logic output part comprises:
a first logic part which compares the comparison results of the first register part with the comparison results of the second register part at levels of the step voltage, respectively; and
a second logic part which receives outputs from the first logic part at the levels of the step voltage, respectively, and outputs a logical value of the read signal voltage.

6. The device of claim 4, wherein
the first logic part outputs results of NAND operations between inversion signals of the comparison results from the first register part and the comparison results from the second register part, and
the second logic part outputs a result of an AND operation of the NAND operation results from the first logic part at the levels of the step voltage, respectively, as a logical value of the read signal voltage.

7. The device of claim 5, wherein
the first logic part outputs results of NAND operations between inversion signals of the comparison results from the first register part and the comparison results from the second register part, and
the second logic part outputs a result of an AND operation of the NAND operation results from the first logic part at the levels of the step voltage, respectively, as a logical value of the read signal voltage.

8. The device of claim 2, wherein the comparator is an operational amplifier which compares the voltage of the selected one of the second bit lines or the reference voltage with the detection reference voltage.

9. The device of claim 1, further comprising:
a first precharge transistor which precharges the first bit lines; and
a second precharge transistor which precharges the second bit lines.

10. The device of claim 2, wherein after at least a precharge operation is performed, a storage operation is repeatedly performed each time the step voltage changes, the precharge operation by the first and second precharge transistors precharging the first and second bit lines, and the storage operation by the first and second register parts storing the comparison results.

11. The device of claim 3, wherein after at least a precharge operation is performed, a storage operation is repeatedly performed each time the step voltage changes, the precharge operation by the first and second precharge transistors precharging the first and second bit lines, and the storage operation by the first and second register parts storing the comparison results.

12. The device of claim 1, further comprising a write transistor connected to the first bit lines to transmit a write signal voltage to the first bit lines.

13. The device of claim 12, wherein the write transistor transmits the write signal voltage corresponding to a same logical value as a logical value of the read signal voltage to the first bit lines or transmits the write signal voltage input from outside to the first bit lines.

14. The device of claim 1, further comprising a clamp transistor which is connected to the first bit lines at a time of reading, wherein
the sense part receives a voltage of selected one of the second bit lines during a period in which the clamp transistor flows a current to the memory cells via the first bit lines, respectively.

15. The device of claim 14, wherein the sense part receives a voltage of one of the second bit lines brought to an equilibrium state during a period in which the clamp transistor flows a current to the memory cells.

16. The device of claim 1, wherein
the first transistor is an N transistor, and
a voltage of the step voltage line lowers in a stepwise manner during read.

17. The device of claim 1, wherein
the first transistor is a P transistor, and
a voltage of the step voltage line increases in a stepwise manner during read.

18. The device of claim 2, wherein
the first transistor is an N transistor, and
a voltage of the step voltage line lowers in a stepwise manner during read.

19. The device of claim 2, wherein
the first transistor is a P transistor, and
a voltage of the step voltage line increases in a stepwise manner during read.

* * * * *